United States Patent [19]
Shiozawa et al.

[11] Patent Number: 5,970,352
[45] Date of Patent: Oct. 19, 1999

[54] FIELD EFFECT TRANSISTOR HAVING ELEVATED SOURCE AND DRAIN REGIONS AND METHODS FOR MANUFACTURING THE SAME

[75] Inventors: Jun-ichi Shiozawa; Yoshitaka Tsunashima; Katsuya Okumura, all of Yokohama, Japan

[73] Assignee: Kabushiki Kaisha Toshiba, Kawasaki, Japan

[21] Appl. No.: 09/064,716

[22] Filed: Apr. 23, 1998

[51] Int. Cl.⁶ .................................................. H01L 21/336
[52] U.S. Cl. .......................... 438/300; 438/305; 438/442; 438/482
[58] Field of Search ...................................... 438/221, 222, 438/300, 301, 303, 305, 306, 368, 369, 442, 443, 482, 532, 583

[56] References Cited

U.S. PATENT DOCUMENTS

| | | | |
|---|---|---|---|
| 4,041,518 | 8/1977 | Shimizu et al. | 357/23 |
| 4,111,725 | 9/1978 | Cho et al. | 148/175 |
| 4,789,644 | 12/1988 | Meda | 437/41 |
| 5,001,082 | 3/1991 | Goodwin-Johansson | 438/301 |
| 5,079,180 | 1/1992 | Rodder et al. | 437/44 |
| 5,118,639 | 6/1992 | Roth et al. | 437/41 |
| 5,156,994 | 10/1992 | Moslehi | 437/89 |
| 5,250,454 | 10/1993 | Maszara | 437/41 |
| 5,336,903 | 8/1994 | Ozturke | 257/19 |
| 5,409,853 | 4/1995 | Yu | 437/41 |
| 5,496,750 | 3/1996 | Moslehi | 437/41 |
| 5,504,031 | 4/1996 | Hsu et al. | 437/57 |
| 5,677,214 | 10/1997 | Hsu | 438/300 |
| 5,691,212 | 11/1997 | Tsai et al. | 438/300 |
| 5,824,586 | 10/1998 | Wollesen et al. | 438/300 |
| 5,893,741 | 4/1999 | Huang | 438/300 |

*Primary Examiner*—Chandra Chaudhari
*Assistant Examiner*—Jack Chen

[57] ABSTRACT

A field effect transistor is manufactured by forming an isolating structure on a semiconductor substrate to define an active area. A gate structure is formed which is insulated from a surface of the active area of the semiconductor substrate. An amorphous silicon film is formed on the gate structure, on the surface of the semiconductor substrate, and on the isolating structure. A first portion of the amorphous silicon film is converted to an epitaxial film and a second portion of the amorphous silicon film is converted to a polysilicon film. Impurities are diffused throughout the polysilicon film and into an upper surface portion of said epitaxial film. The impurity doped polysilicon film and the upper surface portion of the epitaxial film are oxidized to form oxide films and the oxide films are removed so that the epitaxial film remains at least on the active area of the semiconductor substrate. Source and drain regions of the transistor are formed in the active area of the semiconductor substrate.

41 Claims, 4 Drawing Sheets

FIELD EFFECT TRANSISTOR HAVING ELEVATED SOURCE AND DRAIN REGIONS AND METHODS FOR MANUFACTURING THE SAME

BACKGROUND OF THE INVENTION

1. Technical Field

The present invention generally relates to a semiconductor device and methods for manufacturing the semiconductor device and, more particularly, to a field effect transistor having elevated source and drain regions and methods for manufacturing the same.

2. Description of the Related Art

As more highly integrated semiconductor integrated circuit devices are developed, attention must be given to overcoming performance and manufacturing problems which arise when the elements of the circuit devices are reduced in size and positioned closely together. In the case of field effect transistors (FETs), such problems include parasitic capacitance, junction leakage, and short-channel effects. For example, low resistance contacts to the source/drain regions of a transistor are often provided by forming silicide layers such as titanium silicide ($TiSi_2$) or cobalt silicide ($CoSi_2$) on the source and drain regions thereof by a silicide or salicide (self-aligned silicide) process. These silicide and salicide processes can damage the source/drain regions and cause junction leakage. In addition, the source and drain regions of FETs are generally formed by implanting impurities into the semiconductor substrate on which the transistor is formed. In FETs having short-channels (e.g., less than about 3 microns), implanting these impurities too deeply into the substrate can cause short-channel effects to become significant.

FETs having elevated source and drain regions have been developed to address these problems. FIG. 1 is a cross-sectional view of a conventional FET 10 having elevated source and drain regions. FET 10 is formed in an active area 13 of a semiconductor substrate 15 which is defined by a shallow trench isolation structure 17. Source diffusion region 19 and drain diffusion region 21 are formed in the active area 13 with a channel region 23 therebetween. A gate structure 25 is spaced from channel region 23 by a gate insulating film 27. A sidewall insulator 29 is formed on the sidewalls of gate structure 25. Elevated source region 31 and elevated drain region 33 of epitaxial silicon are formed on source diffusion region 19 and drain diffusion region 21, respectively. Since silicide layers for reducing contact resistance are formed on the elevated source and drain regions, source and drain diffusion regions 19 and 21 are not damaged and the junction leakage resulting from such damage can be avoided. In addition, since impurities for forming the source and drain diffusion regions are implanted through the elevated source and drain regions, shallow source and drain diffusion regions may be formed in semiconductor substrate 15, thereby reducing the impact of short-channel effects.

Elevated source and drain regions such as those shown in FIG. 1 are generally formed by selective epitaxial growth. Such selective epitaxial growth causes the elevated source and drain regions to have facets which are designated in FIG. 1 by reference numbers 35 and 37. When impurities are implanted in semiconductor substrate 15 through elevated source and drain regions having facets, the impurities which pass through the relatively thin portions of the raised regions defined by the facets penetrate more deeply into the portions of semiconductor substrate 15 designated by reference numeral 38 in FIG. 1 than the impurities which pass through the thicker portions of the elevated regions. These deeply implanted impurities can increase the significance of short-channel effects. In addition, silicide processes can create spikes at the location of these facets, and the spikes may penetrate into the underlying semiconductor substrate and through the underlying junctions, thereby shorting the source/drain to the substrate.

To overcome the problems associated with facets, a solid phase epitaxial growth process may be used. In this process, an amorphous silicon layer is deposited and then annealed. As a result of the annealing, one portion of the amorphous silicon layer is converted to an epitaxial layer and another portion of the amorphous silicon layer is converted to a polysilicon layer. However, since the etching selectivity between epitaxial silicon and polysilicon generated by this growth process is very low, it is difficult to completely remove the polysilicon layer to leave the epitaxial layer as the elevated source and drain regions.

Accordingly, it would be desirable to provide a FET and methods for manufacturing the same which overcome these and other problems.

SUMMARY OF THE INVENTION

A field effect transistor in accordance with one aspect of the present invention is formed on an active area of a semiconductor substrate of a first conductivity type defined by an isolation structure. Diffusion regions of a second conductivity type are formed in the active area of the semiconductor substrate and a gate structure is insulatively spaced from a channel region between the diffusion regions. A sidewall insulating film is formed on sidewalls of the gate structure and a single crystal silicon layer is formed on each of the diffusion regions and overlaps a portion of the isolation structure. By overlapping the single crystal silicon layer onto the isolation structure, the margin for alignment of contacts to the diffusion regions of the transistor is increased.

A field effect transistor is manufactured in accordance with another aspect of the present invention by forming an isolating structure on a semiconductor substrate to define an active area. A gate structure is formed which is insulated from a surface of the active area of the semiconductor substrate. An amorphous silicon film is formed on the gate structure, on the surface of the semiconductor substrate, and on the isolating structure. A first portion of the amorphous silicon film is converted to an epitaxial film and a second portion of the amorphous silicon film is converted to a polysilicon film. Impurities are diffused throughout the polysilicon film and into an upper surface portion of the epitaxial film. The impurity doped polysilicon film and the upper surface portion of the epitaxial film are oxidized to form oxide films and the oxide films are removed so that the epitaxial film remains at least on the active area of the semiconductor substrate. Source and drain regions of the transistor are formed in the active area of the semiconductor substrate.

In accordance with the above method, due to different diffusion rates, impurities are diffused to the entire polysilicon layer, but to only just a surface portion of the epitaxial layer. Thus, the polysilicon film is completely converted to a highly doped polysilicon film, while only a surface portion of the epitaxial layer is converted to a highly doped epitaxial layer. The oxidation rate of highly doped polysilicon is much higher than that of single crystal silicon. Thus, an annealing step completely oxidizes the highly doped polysilicon film, while only the doped surface portion of the epitaxial film is oxidized. These oxide films are then selectively removed, leaving the epitaxial layer. In accordance with this method, the formation of silicon facets is avoided. In addition, the polysilicon layer can be completely removed.

A field effect transistor is manufactured in accordance with yet another aspect of the present invention by forming an isolating structure on a semiconductor substrate of a first conductivity type to define an active area. A gate structure is formed which is insulated from a surface of the active area of the semiconductor substrate and an amorphous silicon film is formed on the gate structure, on the surface of the semiconductor substrate, and on the isolating structure. A first portion of the amorphous silicon film is converted to an epitaxial film and a second portion of the amorphous silicon film is converted to a polysilicon film. Impurities are diffused throughout the polysilicon film and into an upper surface portion of the epitaxial film. The polysilicon film and the upper surface portion of the epitaxial film are removed so that the epitaxial film remains at least on the active area of the semiconductor substrate. Source and drain regions of the transistor are formed in the active area of the semiconductor substrate.

In accordance with the above method, due to different diffusion rates, impurities are diffused to the entire polysilicon layer, but to only just a surface portion of the epitaxial layer. Thus, the polysilicon film is completely converted to a highly doped polysilicon film, while just a surface portion of the epitaxial layer is converted to a highly doped epitaxial layer. Since the etching selectivity of doped silicon layers to undoped silicon layers is generally high, an etching process can be used to remove the doped layers, leaving behind the undoped epitaxial single crystal silicon layer. As with the previously described method, the formation of silicon facets is avoided. In addition, the polysilicon layer can be completely removed.

These and other features and advantages of the present invention will be better understood from a reading of the following detailed description in conjunction with the accompanying drawings.

DETAILED DESCRIPTION

The invention is described below in terms of a field effect transistor (FET). Such a field effect transistor may be used in a logic device or in other well-known types of integrated circuits. The teachings of the present invention are applicable to field effect transistors used in a dynamic random access memory (DRAM) and to field effect transistors which include a charge storage layer such as a floating gate and which are incorporated in semiconductor memory devices such as EPROMs or EEPROMs.

Figure 1:
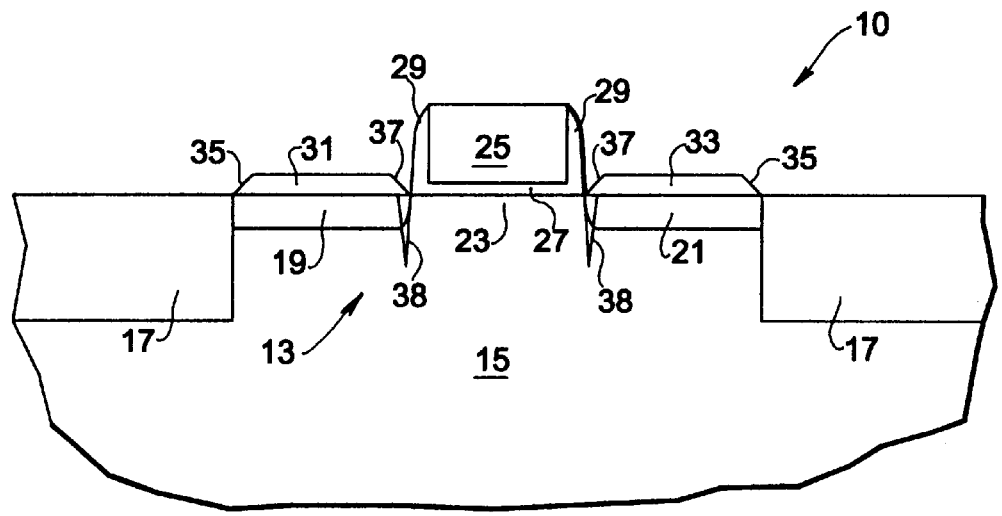
FIG. 1 is a cross-sectional view of a conventional field effect transistor 10 having elevated source and drain regions.
Figure 2:
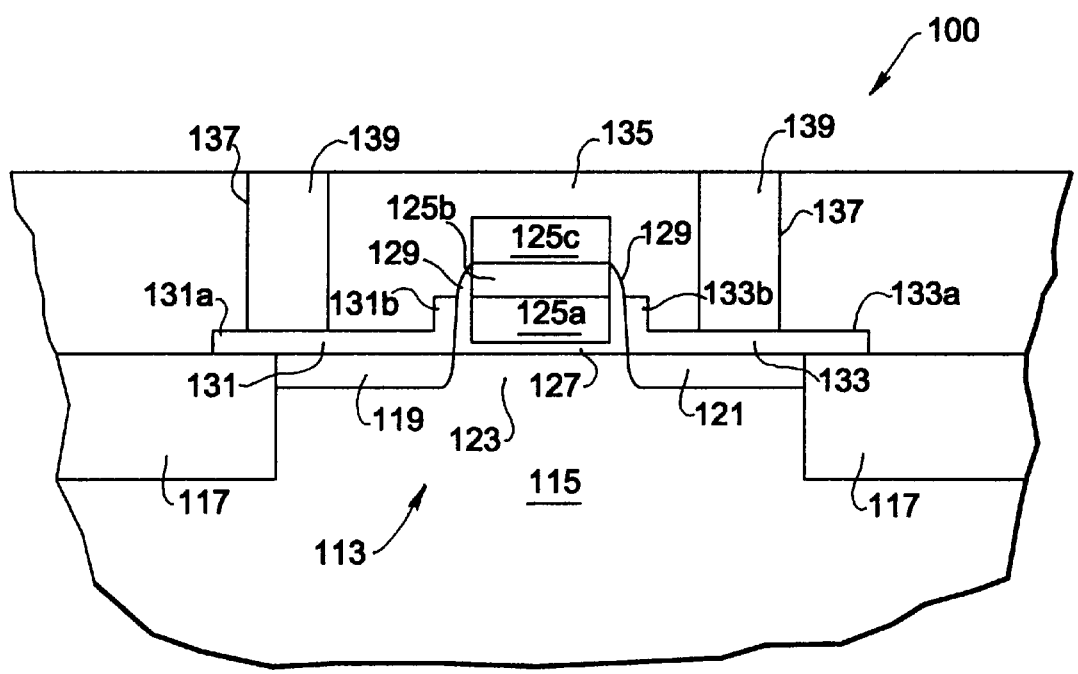
FIG. 2 is a cross-sectional view of a field effect transistor 100 having elevated source and drain regions in accordance with the present invention.

FIG. 2 is a cross-sectional view of a metal oxide semiconductor field effect transistor (MOSFET) 100, which includes elevated source and drain regions, in accordance with the present invention. MOSFET 100 is formed in an active area 113 of a semiconductor substrate 115 which is defined by a shallow trench isolation structure 117. N-type source diffusion region 119 and N-type drain diffusion region 121 are formed in active area 113 with a channel region 123 therebetween. A gate structure 125 is spaced from channel region 123 by a gate insulating film 127. Gate structure 125 includes a polysilicon gate electrode portion 125a, a silicide gate electrode portion 125b, and a gate electrode cap portion 125c. A sidewall insulating film 129 is formed on the sidewalls of gate structure 125. Elevated source region 131 and elevated drain region 133 are formed on source diffusion region 119 and drain diffusion region 121, respectively. Horizontal portions 131a and 133a of elevated source region 131 and elevated drain region 133, respectively, overlap onto shallow trench isolation structure 117. Vertical portions 131b and 133b of elevated source region 131 and elevated drain region 133, respectively, are formed on sidewall insulator 129 and extend in a direction away from the surface of semiconductor substrate 115. An interlayer insulating film 135 includes contact openings 137 formed therein to expose surface portions of elevated source and drain regions 131 and 133. Contacts 139 of a conductive material are formed in contact openings 137.

A method of manufacturing MOSFET 100 in accordance with the present invention will be described below with reference to FIGS. 3(a)–3(j). Shallow trench isolation structure 117 is formed in a P-type single crystal silicon substrate 115. Substrates of other semiconductor materials such as germanium (Ge), gallium arsenide (GaAs), or gallium arsenide phosphide (GaAsP) may be utilized. Shallow trench isolation structure 117 may be formed in accordance with well-known conventional techniques in which a trench is formed by an etching process (such as reactive ion etching) in semiconductor substrate 115 and the trench is then filled with an insulating material such as silicon dioxide ($SiO_2$). Shallow trench isolation structure 117 defines active area 113 on semiconductor substrate 115 in which MOSFET 100 will be formed. While a shallow trench isolation structure is advantageous in highly integrated semiconductor devices for improved planarity, an active area may be formed in accordance with other well known techniques, e.g. by forming field oxide films by the local oxidation of silicon (LOCOS).

Gate insulating film 127 having a thickness of about 50 Å is formed on active area 113 by a thermal oxidation process at a temperature of about 800° C. A first conductive film, a second conductive film, and an insulating film are then successively formed on semiconductor substrate 115 (i.e., on gate insulating film 127 and on shallow trench isolation structure 117). The first conductive film may be a polysilicon film having a thickness of about 2000 Å and which is formed, for example, by a low pressure chemical vapor deposition (LPCVD) process. The second conductive film may be a silicide film having a thickness of 500 Å and which is formed, for example, by a sputtering process. The insulating film may be a silicon nitride ($Si_3N_4$) film having a thickness of 2000 Å and which is formed, for example, by an LPCVD process. The silicide film may be a tungsten silicide (WSi) film. The insulating film, the second conductive film, and first conductive film are patterned using conventional photolithography and anisotropic plasma etching processes to provide gate structure 125 including polysilicon gate electrode portion 125a, silicide gate electrode portion 125b, and gate electrode cap portion 125c. Sidewall insulating film 129 of silicon dioxide ($SiO_2$), is formed on the sidewalls of gate electrode portions 125a and 125b. Sidewall insulating film 129 may be formed by first performing an oxidation in a dry $O_2$ atmosphere at 1050° C. for 100 seconds. The oxidation rates of $N^+$ polysilicon and WSi are two to three times higher than the oxidation rate of the silicon substrate. Thus, an $SiO_2$ film having a thickness of about 200 Å to about 300 Å is formed on the sidewalls of gate electrode portions 125a and 125b and an $SiO_2$ film having a thickness of about 80 Å to about 100 Å is formed on the surface of substrate 115. Next, an $SiO_2$ film having a thickness of about 200 Å is formed on the $SiO_2$ films formed by the oxidation by an LPCVD process. Then, the $SiO_2$ films on the silicon substrate are etched using a reactive ion etching (RIE) process to leave sidewall insulating film 129.

Figure 3A:
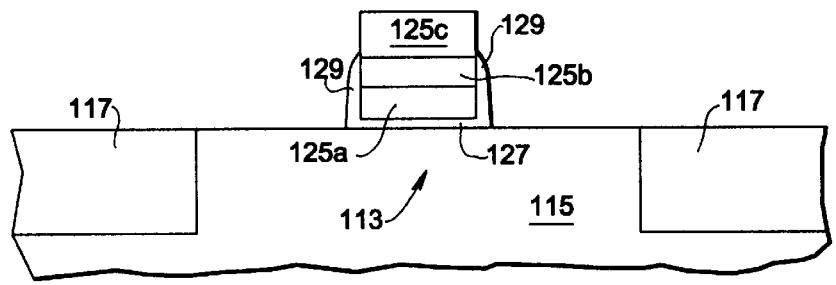
FIGS. 3(a)–3(j) are cross-sectional views showing the steps for manufacturing field effect transistor 100 of FIG. 2.
Figure 3B:
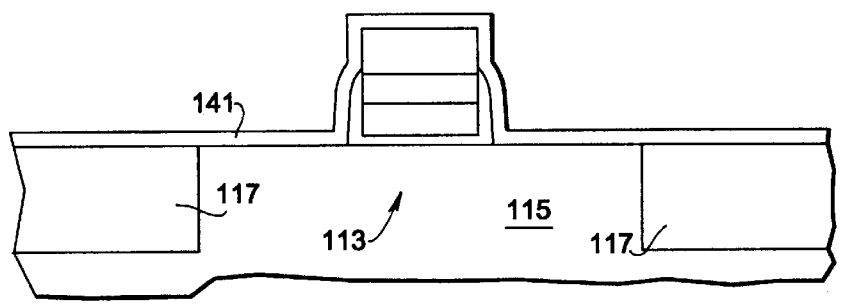
Figure 3C:
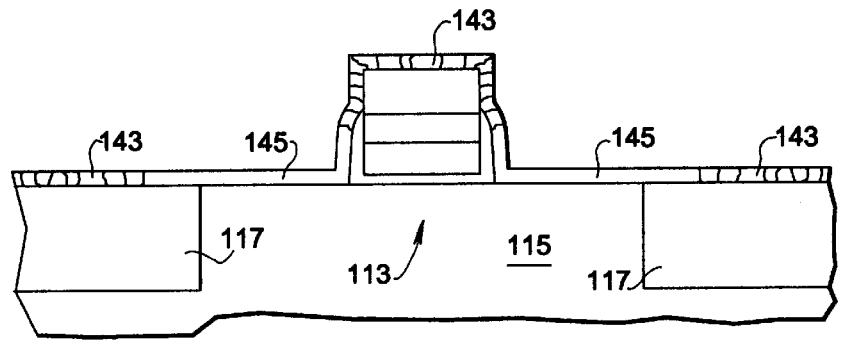

An amorphous silicon film 141 having a thickness in a range of about 200 Å to about 300 Å is then formed on the semiconductor substrate (i.e., on the sidewalls and the top of gate structure 125, on the surface of active area 113 of semiconductor substrate 115, and on shallow trench isolation structure 117) as shown in FIG. 3(b). Amorphous silicon film 141 is formed, for example, by low pressure chemical vapor deposition (LPCVD) at a temperature in a range from about 480° C. to about 550° C. and at a pressure in a range from about 0.1 Torr to about 1.0 Torr.

Next, a low temperature (e.g., in a range from about 600° C. to about 800° C.) annealing process is carried out in an inert ambient such as argon or nitrogen. As a result of this annealing process, the amorphous silicon film 141 is epitaxially regrown in areas where the crystalline structure of semiconductor substrate 115 provides a seed for crystallization of the overlying amorphous silicon. In areas where semiconductor substrate 115 does not provide a seed for crystallization, the amorphous silicon is converted to a polysilicon film 143. As can be seen with reference to FIG. 3(c), the epitaxial regrowing process also proceeds horizontally and thus epitaxial film 145 overlaps shallow trench isolation structure 117 by about 0.1 mm (micrometers). As shown in the Figures, this solid phase epitaxial growth method can also result in some vertical growth if the growth rate of the epitaxial silicon is much higher than the nucleation rate.

Figure 3D:
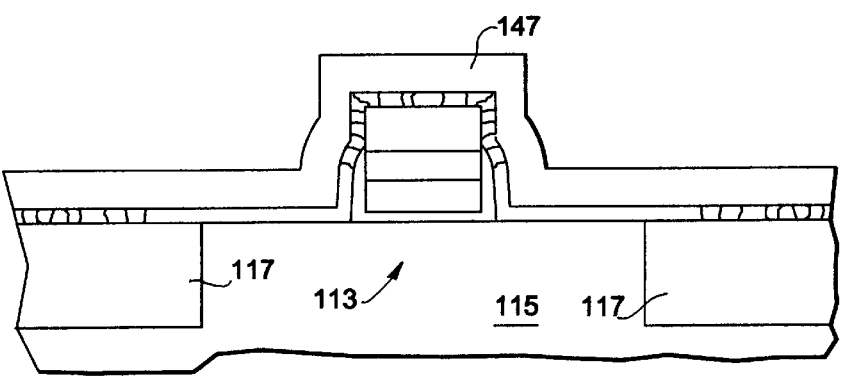
Figure 3E:
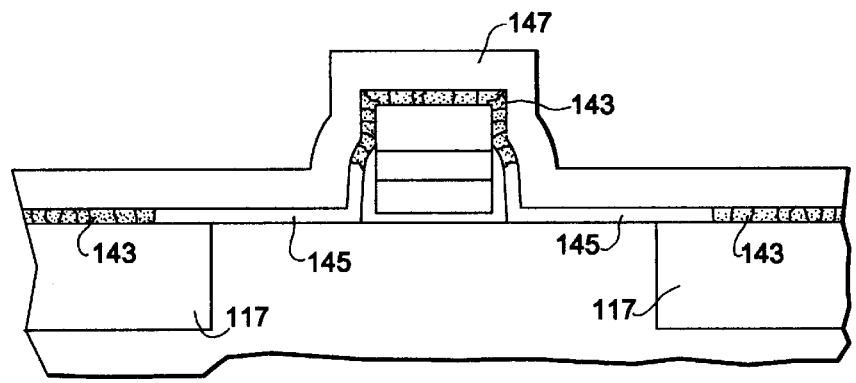

As shown in FIG. 3(d), an impurity doped film 147 is formed on polysilicon film 143 and epitaxial film 145. Suitable impurities for doping film 147 include phosphorus (P), arsenic (As), boron (B), and antimony (Sb). In one implementation, impurity doped film 147 is a phosphorus-silicate-glass (PSG) film formed by chemical vapor deposition having a thickness of about 2000 Å and an impurity concentration of about $1 \times 10^{20}/cm^3$. Other suitable silicate-glass films include arsenic-silicate glass (AsSG) films, boron-silicate-glass (BSG), and antimony-silicate glass (SbSG) films. Alternatively, impurity doped film 147 may be formed by depositing an undoped TEOS layer and then implanting impurities (e.g., phosphorus, arsenic, boron, or antimony) into the TEOS layer. While phosphorus, arsenic, boron, and antimony impurities have been identified as suitable for use in the present method, the invention is not limited in this respect. However, as will become apparent from the discussion below, the impurities which are utilized should have a diffusion rate in single crystal silicon which is lower than the diffusion rate of the impurities in polysilicon.

After forming impurity doped film 147, an annealing process is carried out at a temperature in a range from about 800° C. to about 950° C. in an inert ambient (such as argon or nitrogen) to diffuse impurities from impurity doped film 147 to polysilicon film 143 and epitaxial film 145. The diffusion rate in single crystal silicon of the impurities outdiffused from impurity doped film 147 is an order of magnitude lower than the diffusion rate of these impurities in polysilicon. Thus, while the annealing diffuses impurities throughout polysilicon film 143 to convert the film to an $N^+$-type polysilicon film, the annealing diffuses impurities only to a surface portion of epitaxial film 145. After the annealing process, impurity doped film 147 is stripped by wet etching using, for example, diluted $NH_4F$ or diluted HF.

Figure 3F:
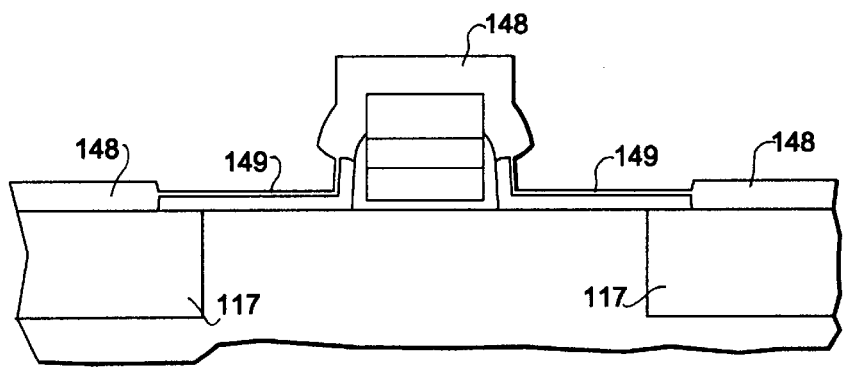

An oxidation process is then carried out at a temperature in a range from about 700° C. to about 950° C. The process may be either a dry or a wet oxidation process. The oxidation rate of $N^+$-type polysilicon is an order of magnitude higher than the oxidation rate of single crystal silicon. Thus, in the oxidation process, the $N^+$-type polysilicon layer 143 is completely oxidized to form an oxide layer 148, while only a surface portion (e.g., the top 50 Å) of epitaxial layer 145 is oxidized to form an oxide layer 149 as shown in FIG. 3(f).

Figure 3G:
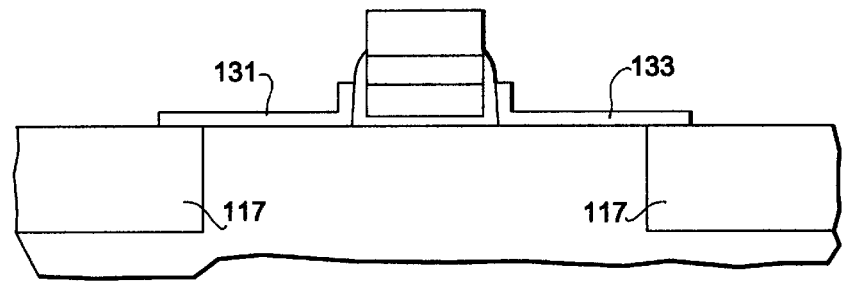

After the oxidation process, oxide films 148 and 149 are removed by a wet etching process using, for example, diluted $NH_4F$ or diluted HF to leave elevated source region 131 of epitaxial silicon and elevated drain region 133 of epitaxial silicon as shown in FIG. 3(g). The thickness of elevated source and drain regions 131 and 133 is in a range of about 300 Å to about 500 Å. As shown in FIG. 3(g), elevated source and drain regions 131 and 133 overlap shallow trench isolation structure 117 by about 0.1 mm (micrometer).

Figure 3H:
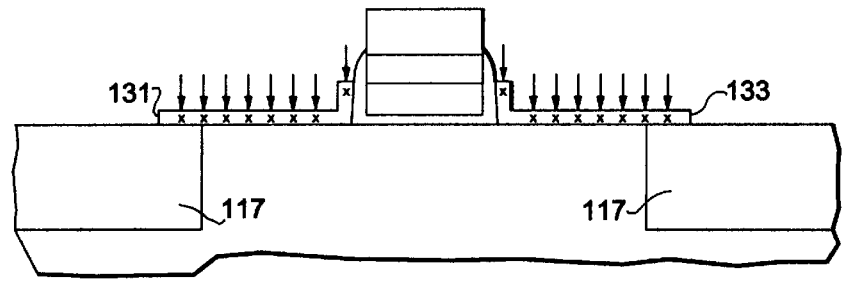
Figure 3I:
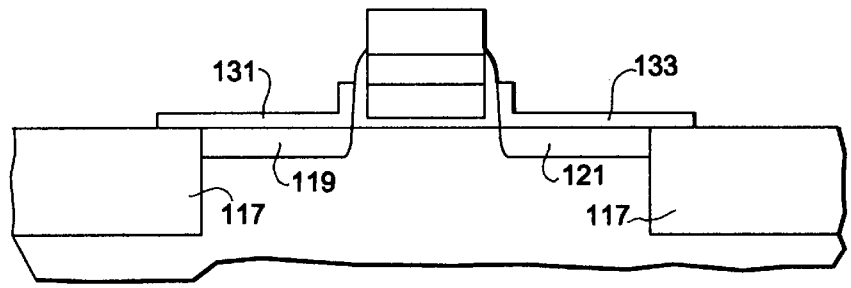
Figure 3J:
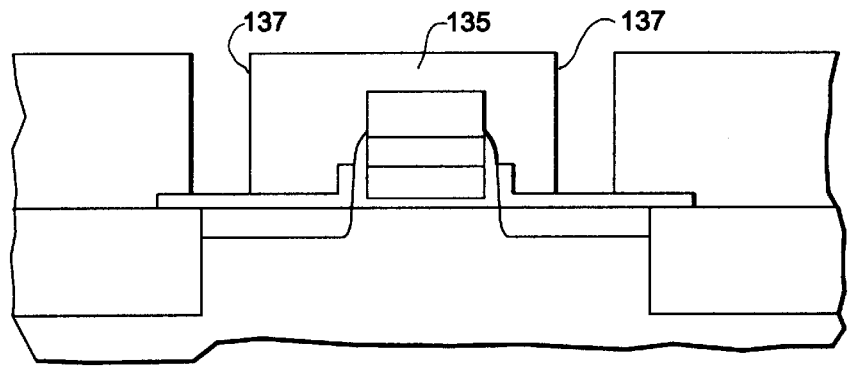

With reference to FIG. 3(h), N-type impurities such as phosphorus, arsenic, or antimony are then implanted into elevated source and drain regions 131 and 133 by an ion implantation process with a dose of $1 \times 10^{14}$ cm$^{-2}$ at an acceleration energy of 30 keV. After this ion implantation, an annealing process at a temperature of 950° C. in an ambient such as nitrogen is carried out to diffuse the impurities implanted in elevated source and drain regions 131 and 133 into semiconductor substrate 115 to form source diffusion region 119 and drain diffusion region 121 as shown in FIG. 3(i). Then, an interlayer insulating film 135 of, for example, TEOS is formed on semiconductor substrate 115. Contact openings 137 are then formed in interlayer insulating film 135 by conventional photolithography and etching processes. Elevated source and drain regions 131 and 133 serve as stopper layers for the contact etching. In addition, since the elevated source and drain regions 131 and 133 overlap onto shallow trench isolation structure 117, misalignment problems for forming the contact openings can be reduced. A conductive material such as $N^+$-type polysilicon is then formed in contact openings 137 to form contacts 139 to the elevated source and drain regions 131 and 133.

In accordance with the above method, due to the different diffusion rates, impurities are diffused to entire polysilicon layer 143, but to only just a surface portion of the epitaxial layer 145. Thus, the polysilicon film is converted to a highly doped polysilicon film, while only a surface portion of the epitaxial layer is converted to a highly doped epitaxial layer. The oxidation rate of highly doped polysilicon is much higher than that of single crystal silicon. Thus, an annealing step completely oxidizes the highly doped polysilicon film, while only the doped surface portion of the epitaxial film is oxidized. These oxide films are then selectively removed, leaving the elevated source and drain regions. In accordance with this method, the formation of silicon facets is avoided. In addition, the polysilicon layer can be completely removed. Still further, the overlap of the elevated source and drain regions onto the shallow trench isolation structures increases the alignment margin for forming contacts to the elevated source and drain regions.

The present invention is not limited to the above-described method and modifications may be made within the scope of this invention. For example, impurities may be diffused to polysilicon film 143 and epitaxial film 145 using a vapor phase deposition process rather than impurity doped layer 147. For example, phosphorus may be diffused using a $POCl_3$ vapor phase deposition process; arsenic may be diffused using a $AsH_3$ vapor phase deposition process; and boron may be diffused using a $B_2H_6$ vapor phase deposition process.

In addition, the step of oxidizing the $N^+$-type polysilicon layer 143 and the epitaxial layer 145 may be omitted. Specifically, there is generally a significant difference in the etching rates of highly doped polysilicon and intrinsic single crystal silicon. Thus, $N^+$-type polysilicon layer 143 may be selectively etched to leave epitaxial film 145. For example, a down-flow etching process may be used. Using a $CF_4/O_2$ gas mixture, the etching rate of $N^+$ polysilicon is much higher than the etching rate of undoped single crystal silicon. When the $CF_4$ flow rate is 200 sccm, the $O_2$ flow rate is 20 sccm, and the power is 400 mW, the etching rate of $N^+$ polysilicon is about 4000 Å/minute and the etching rate of undoped single crystal silicon is about 200 Å/minute.

In addition, a silicide layer of, for example, titanium silicide or cobalt silicide may be formed on elevated source and drain regions 131 and 133 to provide for low resistance contacts. The silicide layer may, for example, be formed prior to forming interlayer insulating film 135.

While the field effect transistors described above are N-channel type field effect transistors, it will be apparent that this is applicable to P-channel type field transistors which include, for example, P-type source and drain diffusion regions formed in an N-type silicon substrate. Boron may be used to form the P-type source and drain diffusion regions.

While the invention has been described in detail with reference to the appended drawings, the invention is limited in scope only by the claims. Moreover, any patent or publication cited herein should be construed to be incorporated by reference as to any subject matter deemed essential to the present disclosure.

We claim:

1. A method of manufacturing a field effect transistor, comprising the steps of:
   forming an isolating structure on a semiconductor substrate of a first conductivity type to define an active area;
   forming a gate structure which is insulated from a surface of the active area of said semiconductor substrate;
   forming an amorphous silicon film on said gate structure, on the surface of said semiconductor substrate, and on said isolating structure;
   converting a first portion of said amorphous silicon film to an epitaxial film and a second portion of said amorphous silicon film to a polysilicon film;
   diffusing impurities throughout said polysilicon film and into an upper surface portion of the film;
   oxidizing said polysilicon film and said upper surface portion of said epitaxial film to form oxide films;
   removing said oxide films so that said epitaxial film remains at least on the active area of said semiconductor substrate; and
   forming source and drain regions of said transistor in the active area of said semiconductor substrate.

2. The method according to claim 1, wherein said gate structure comprises a polysilicon gate electrode portion, a silicide gate electrode portion, and a gate electrode cap portion.

3. The method according to claim 2, wherein said silicide gate electrode portion comprises tungsten silicide.

4. The method according to claim 2, wherein said gate electrode cap portion comprises silicon nitride.

5. The method according to claim 1, wherein said isolating structure comprises a shallow trench isolation (STI) structure.

6. The method according to claim 1, wherein said amorphous silicon film is formed by low pressure chemical vapor deposition (LPCVD).

7. The method according to claim 6, wherein said amorphous silicon film is deposited at a temperature in a range from about 480° C. to about 550° C. and at a pressure in a range from about 0.1 Torr to about 1.0 Torr.

8. The method according to claim 1, wherein said amorphous silicon film has a thickness in a range from about 200 Å to about 300 Å.

9. The method according to claim 1, wherein said epitaxial film is arranged at least on the active area of said semiconductor substrate.

10. The method according to claim 1, wherein said epitaxial film is arranged on the active area of said semiconductor substrate, at least a portion of said isolating structure, and at least a portion of said gate structure.

11. The method according to claim 1, wherein the step of diffusing impurities into said epitaxial film and said polysilicon film comprises:
    forming an impurity doped film on said epitaxial film and said polysilicon film;
    heating to diffuse impurities to said epitaxial film and said polysilicon film; and
    removing said impurity doped film.

12. The method according to claim 11, wherein the heating is at a temperature in a range of about 800° C. to about 950° C. and in an ambient which is one of the group consisting of argon and nitrogen.

13. The method according to claim 1, wherein the step of diffusing impurities into said epitaxial film and said polysilicon film comprises a vapor phase deposition.

14. The method according to claim 13, wherein the vapor phase deposition is one of a group consisting of a $POCl_3$ vapor phase deposition, an $AsH_3$ vapor deposition, and a $B_2H_6$ vapor deposition.

15. The method according to claim 1, wherein the selective oxidation comprises a dry oxidation process at a temperature in a range of about 700° C. and 950° C.

16. The method according to claim 1, wherein the selective oxidation comprises a wet oxidation process at a temperature in a range of about 700° C. and 950° C.

17. The method according to claim 1, wherein said oxide films are removed by one of the group consisting of diluted $NH_4F$ and diluted HF.

18. The method according to claim 1, wherein the thickness of the remaining epitaxial layer is in a range from about 300 Å to about 500 Å.

19. The method according to claim 1, wherein the step of forming said source/drain regions comprises:
    ion implanting impurities into said remaining epitaxial layer; and
    heating to diffuse the implanted impurities.

20. The method according to claim 19, wherein the impurities are one of the group consisting of phosphorus, arsenic, and antimony.

21. The method according to claim 19, wherein the impurities are boron.

22. The method according to claim 1, comprising the further steps of:

forming an interlayer insulating film on said transistor; and forming contacts to one or both of said source/drain regions of said transistor.

23. A method of manufacturing a field effect transistor, comprising the steps of:

forming an isolating structure on a semiconductor substrate of a first conductivity type to define an active area;

forming a gate structure which is insulated from a surface of the active area of said semiconductor substrate;

forming an amorphous silicon film on said gate structure, on the surface of said semiconductor substrate, and on said isolating structure;

converting a first portion of said amorphous silicon film to an epitaxial film and a second portion of said amorphous silicon film to a polysilicon film;

diffusing impurities throughout said polysilicon film and into an upper surface portion of said epitaxial film;

selectively removing said polysilicon film and the upper surface portion of said epitaxial film so that said epitaxial film remains at least on the active area of said semiconductor substrate; and forming source and drain regions of said transistor in the active area of said semiconductor substrate.

24. The method according to claim 23, wherein said gate structure comprises a polysilicon gate electrode portion, a silicide gate electrode portion, and a gate electrode cap portion.

25. The method according to claim 24, wherein said silicide gate electrode portion comprises tungsten silicide.

26. The method according to claim 24, wherein said gate electrode cap portion comprises silicon nitride.

27. The method according to claim 23, wherein said isolating structure comprises a shallow trench.

28. The method according to claim 23, wherein said amorphous silicon film is formed by low pressure chemical vapor deposition (LPCVD).

29. The method according to claim 28, wherein said amorphous silicon film is deposited at a temperature in a range from about 480° C. to about 550° C. and at a pressure in a range from about 0.1 Torr to about 1.0 Torr.

30. The method according to claim 23, wherein said amorphous silicon film has a thickness in a range from about 200 Å to about 300 Å.

31. The method according to claim 23, wherein said epitaxial film is arranged at least on the active area of said semiconductor substrate.

32. The method according to claim 23, wherein said epitaxial film is arranged on the active area of said semiconductor substrate, at least a portion of said isolating structure, and at least a portion of said gate structure.

33. The method according to claim 23, wherein the step of diffusing impurities into said epitaxial film and said polysilicon film comprises:

forming an impurity doped film on said epitaxial film and said polysilicon film;

heating to diffuse impurities to said epitaxial film and said polysilicon film; and removing said impurity doped film.

34. The method according to claim 33, wherein the heating is at a temperature in a range of about 800° C. to about 950° C. and in an ambient which is one of the group consisting of argon and nitrogen.

35. The method according to claim 23, wherein the step of diffusing impurities into said epitaxial film and said polysilicon film comprises a vapor phase deposition.

36. The method according to claim 35, wherein the vapor phase deposition is one of a group consisting of a $POCl_3$ vapor phase deposition, an $AsH_3$ vapor deposition, and a $B_2H_6$ vapor deposition.

37. The method according to claim 23, wherein the thickness of the remaining epitaxial layer is in a range from about 300 Å to about 500 Å.

38. The method according to claim 23, wherein the step of forming said source/drain regions comprises:

ion implanting impurities into said remaining epitaxial layer; and heating to diffuse the implanted impurities.

39. The method according to claim 38, wherein the impurities are boron.

40. The method according to claim 38, wherein the impurities are one of the group consisting of phosphorous, arsenic, and antimony.

41. The method according to claim 23, comprising the further steps of: forming an interlayer insulating film on said transistor; and forming contacts to one or both of said source/drain regions of said transistor.

* * * * *

UNITED STATES PATENT AND TRADEMARK OFFICE
CERTIFICATE OF CORRECTION

PATENT NO.: 5,970,352

DATED: October 19, 1999

INVENTORS: Jun-ichi SHIOZAWA, *et al.*

It is certified that errors appear in the above-identified patent and that said Letters Patent is hereby corrected as shown below:

On the cover page, in the [54] Title, delete "AND METHODS FOR MANUFACTURING THE SAME"; and before "FIELD", insert --METHOD OF FORMING--.

In Claim 1, column 7, line 54, after "the", insert --epitaxial--.

In Claim 15, column 8, line 44, delete "selective".

In Claim 16, column 8, line 47, delete "selective".

Signed and Sealed this

Third Day of April, 2001

Attest:

NICHOLAS P. GODICI

Attesting Officer

Acting Director of the United States Patent and Trademark Office